(12) United States Patent
Klein (10) Patent No.: US 11,780,024 B2
(45) Date of Patent: Oct. 10, 2023

(54) WELDING POWER SUPPLY HAVING A COOLING DEVICE

(71) Applicant: SKS WELDING SYSTEMS GMBH, Kaiserslautern (DE)

(72) Inventor: Thomas Klein, Rodenbach (DE)

(73) Assignee: SKS WELDING SYSTEMS GMBH, Kaiserslautern (DE)

( * ) Notice: Subject to any disclaimer, the term of this patent is extended or adjusted under 35 U.S.C. 154(b) by 623 days.

(21) Appl. No.: 16/649,634

(22) PCT Filed: Sep. 22, 2018

(86) PCT No.: PCT/EP2018/000445
§ 371 (c)(1),
(2) Date: May 22, 2020

(87) PCT Pub. No.: WO2019/057333
PCT Pub. Date: Mar. 28, 2019

(65) Prior Publication Data
US 2020/0384564 A1 Dec. 10, 2020

(30) Foreign Application Priority Data

Sep. 22, 2017 (DE) ..................... 10 2017 009 143.9

(51) Int. Cl.
*B23K 9/10* (2006.01)
*B23K 9/32* (2006.01)
(Continued)

(52) U.S. Cl.
CPC .............. *B23K 9/1006* (2013.01); *B23K 9/32* (2013.01); *B23K 37/003* (2013.01); *H05K 7/20918* (2013.01)

(58) Field of Classification Search
CPC ...... B23K 9/1006; B23K 9/32; B23K 37/003; H05K 7/20918
See application file for complete search history.

(56) References Cited

U.S. PATENT DOCUMENTS

| 2016/0129517 A1* | 5/2016 | Altekruse | B23K 9/325 219/130.1 |
| 2017/0014934 A1* | 1/2017 | Borneman | B23K 9/16 |

(Continued)

FOREIGN PATENT DOCUMENTS

| DE | 19926007 A1 | 1/2000 |
| JP | S5142042 A | 4/1976 |
| JP | 2010099692 A | 4/2010 |

OTHER PUBLICATIONS

Machine Translation of Luscher, DE 199 26 007, performed on Oct. 11, 2022 (Year: 2000).*

*Primary Examiner* — Brian W Jennison
(74) *Attorney, Agent, or Firm* — Tarolli, Sundheim, Covell & Tummino, LLP (57) ABSTRACT

A welding current source for supplying an electric welding current circuit with electric current and electric voltage for carrying out an electric welding process, wherein the welding current source is provided with a power conditioning device for conditioning electric current supplied to the welding current source for suitability in an electric welding process, wherein furthermore on a housing of the welding current source there are provided two pole contact devices, each of which protrude from the housing, and the welding current source is equipped with a cooling device, with which thermal heat loss released by the welding current source can be dissipated. In the case of such a welding current source and despite sufficient cooling of the electrical components, it shall be possible that the housing of the welding current source can be designed to be also smaller than before.

11 Claims, 5 Drawing Sheets

(51) Int. Cl.
*B23K 37/00* (2006.01)
*H05K 7/20* (2006.01)

(56) References Cited

U.S. PATENT DOCUMENTS

2017/0150654 A1* 5/2017 Kubo ................ H05K 7/20918
2017/0288565 A1* 10/2017 Bethke .................. H02M 1/32

* cited by examiner

WELDING POWER SUPPLY HAVING A COOLING DEVICE

RELATED APPLICATIONS

The present invention is a U.S. National Stage under 35 USC 371 patent application, claiming priority to Serial No. PCT/EP2018/000445, filed on 22 Sep. 2018; which claims priority of DE 102017009143.9, filed on 22 Sep. 2017, the entirety of both of which are incorporated herein by reference.

The invention relates to a welding current source for supplying electric current and electric voltage to a welding circuit for executing an electric welding process, wherein the welding current source is equipped with a current conditioning device for conditioning the electric current supplied by the welding current source for suitability regarding an electric welding process, wherein furthermore on a housing of the welding current source, there are provided two pole contact devices, which each protrude out of the housing, and the welding current source is equipped with a cooling device, with which thermal heat losses released by the welding current source can be dissipated.

There is a plurality of different welding processes. The present invention is especially meaningful for the various procedures and welding current circuit devices pertaining to arc welding. These are based on heat generation of an electric arc between a welding electrode and a workpiece on which a weld is to be undertaken. By means of the heat generation, the material(s) to be welded can be melted locally. In almost all arc welding processes, a shielding gas is supplied for this purpose in the region of the electric arc to allow on the one hand a resistance-decreasing, ionizing atmosphere between the welding electrode and the workpiece, and on the other hand to prevent oxidation of the welding electrode and the workpiece. Instead of an inert gas provided as a shielding gas, an active gas or a mixed form can also be supplied, which is used for the reaction. Likewise, electrodes may be provided, which do not require any external gas supply since the substances required for this are integrated in the electrode and released when the electrode melts.

When applying an electrical voltage to a welding torch inner tube and when contacting the welding wire to the target metal piece, a high electric current flows from a welding torch, via the welding wire and if applicable an electric arc, to the target metal piece and then to the ground. The high current and the electric arc cause the welding wire to melt in a shielding gas atmosphere, which results in wire forming drops and an electric arc being created. This electric arc melts the metal of the target metal piece and the guided welding wire. By the formed drops falling off of the welding wire or by the transfer of the drop in a short circuit to the liquefied location of the target metal piece, these become joined to each other.

Arc welding systems or arc welding circuits are each provided with a welding current source for providing the required electric current and voltage, said current supply needing to be connected to the welding torch of the arc welding system in an electrically conducting manner so that the respective arc weld can be supplied with current and have voltage applied to it. Since there is a high energy demand for producing the conditions prevailing at the process point, welding current sources must provide direct current or alternating current with high current values (jointly referred to as welding current). When used industrially, these are generated from alternating current, which is connected to the welding current source. By means of inductors and power electronics contained in the welding current source, the welding current sources transform the alternating current on the input side into welding current, as it is appropriate for arc welding. High thermal heat loss is hereby typically created that must be dissipated out of the housing to prevent damage, especially of the electronics contained in the welding current source. To this end, a cooling device is typically arranged in the welding current source, by means of which however the housing of the welding current source turns out to be comparatively large.

For that reason, the object of the invention is to provide a welding current source of the type mentioned earlier, in which, in addition to sufficiently cooling the electrical components, there is the possibility of designing the housing of the welding current source to be smaller than before.

This object is achieved according to the invention in a welding current source of the aforementioned type by an inductance device of the current transformer device being arranged in a cooling body and the cooling body along with the inductance device being arranged on a housing outer side of the housing. Within the scope of the invention, it has been shown surprisingly that by moving the cooling device and the inductance device from inside the housing to an outer side of the housing, the housing can be downsized by more than just the volume of the cooling device and the inductance device. For cooling bodies and inductance devices arranged inside the housing space, generally a minimum clearance must be complied with between electronic components and the inductance device, such as the transformer, also arranged in the housing to avoid excessive heating. In addition, fastening materials are required in the housing for fastening the inductance device and the cooling device, which also contribute to enlarging the interior space of the housing. By omitting all of these components and the required wiring in the housing and also by omitting the requirement for maintaining a minimum clearance to the inductance device, the housing can thus turn out to be significantly smaller than would result only by a volume reduction based on the components no longer provided for, according to the invention, within the housing. By means of the measure according to the invention, there is also the advantage that the heat loss can be dissipated into the environment especially quickly and effectively, since there is no risk of heat building up or the dissipation of hot air out of the housing being impeded.

A preferred embodiment of the invention may provide that the inductance device is equipped with at least one transformer, which is arranged inside the cooling body. With such an embodiment of the invention, the cooling body and the inductance device can be arranged in an especially space-saving manner and at the same time, the thermal heat loss caused by the inductance device can be dissipated into the environment.

Despite arranging the inductance device outside of the housing of the welding current source, the inductance device can be reliably protected against damage by the fact that a cover, especially a baffle plate, is arranged over the inductance device. To achieve good heat dissipation despite the cover, it may be appropriately provided that, in a provided use position of the welding current source, the cover is arranged in a region with its greatest clearance to a provided setup surface of the welding current source and with spacing to the inductance device in such a manner that an opening, from which hot air can flow out, results between the cover and the inductance device.

Another preferred embodiment of the invention may provide that the cooling body is arranged on an outer side of a housing rear wall. The rear wall of the housing is especially suited for arranging the cooling body and the inductance device, since by means of recesses in the rear wall here, wiring of the inductance device to electronic components arranged in the housing can be achieved by an especially short route.

Particularly good and quick heat dissipation can be achieved in a preferred embodiment of the invention by cooling ribs of the cooling body, which are arranged spaced apart from each other, running in an at least essentially vertical manner. In a particularly favorable manner, the inherently resulting convection can hereby be used for heat dissipation. Heated air can thus rise unimpeded in the region of the cooling body between the cooling ribs and thus flow in an essentially vertical direction.

Furthermore, the cooling body arranged outside of the housing is preferably equipped in the region of its cooling ribs with a recess, by means of which multiple cooling ribs are interrupted, wherein the recess for arranging the inductance device in the cooling body is provided in the cooling body. The inductance device can thus be inserted preferably from a side facing away from the housing into the recess of the cooling device.

To further increase the heat dissipation and thus the cooling effect, it may be preferably provided that especially on the inductance device side facing away from the housing, there is arranged a fan device. This fan device thus also arranged outside of the housing of the welding current source can be designed especially as an independent assembly, a so-called fan cartridge, and be provided with at least one rotating fan, whose air stream is directed essentially on the inductance device. In a particularly advantageous manner, the fan cartridge can be ideally designed to be open so that the airstream dissipating the heat of the inductance device can flow in the most unimpeded manner possible. The fan cartridge should thus preferably not cover the entire rear side of the cooling body, but preferably essentially only the region of the inductance device. In addition, the upper side of the cooling body should be designed advantageously in such a manner that the outflowing air here can emerge unimpeded out of the cooling body. In a particularly favorable embodiment of the invention, on the upper side of the cooling body, the latter should thus ideally be free of a cover.

Lastly, a development, which has proven itself to be advantageous, of the invention provides that the power welding source is equipped with two or more cooling bodies placed on an outer side of the housing of the welding current source, wherein each of these cooling bodies has at least one inductance device and can be designed in one of the previously described ways.

Additional preferred designs of the invention emerge from the claims, the description and the drawing.

The invention is explained in greater detail by means of embodiments shown in a purely schematic manner in the figures. These depict.

Figure 1:
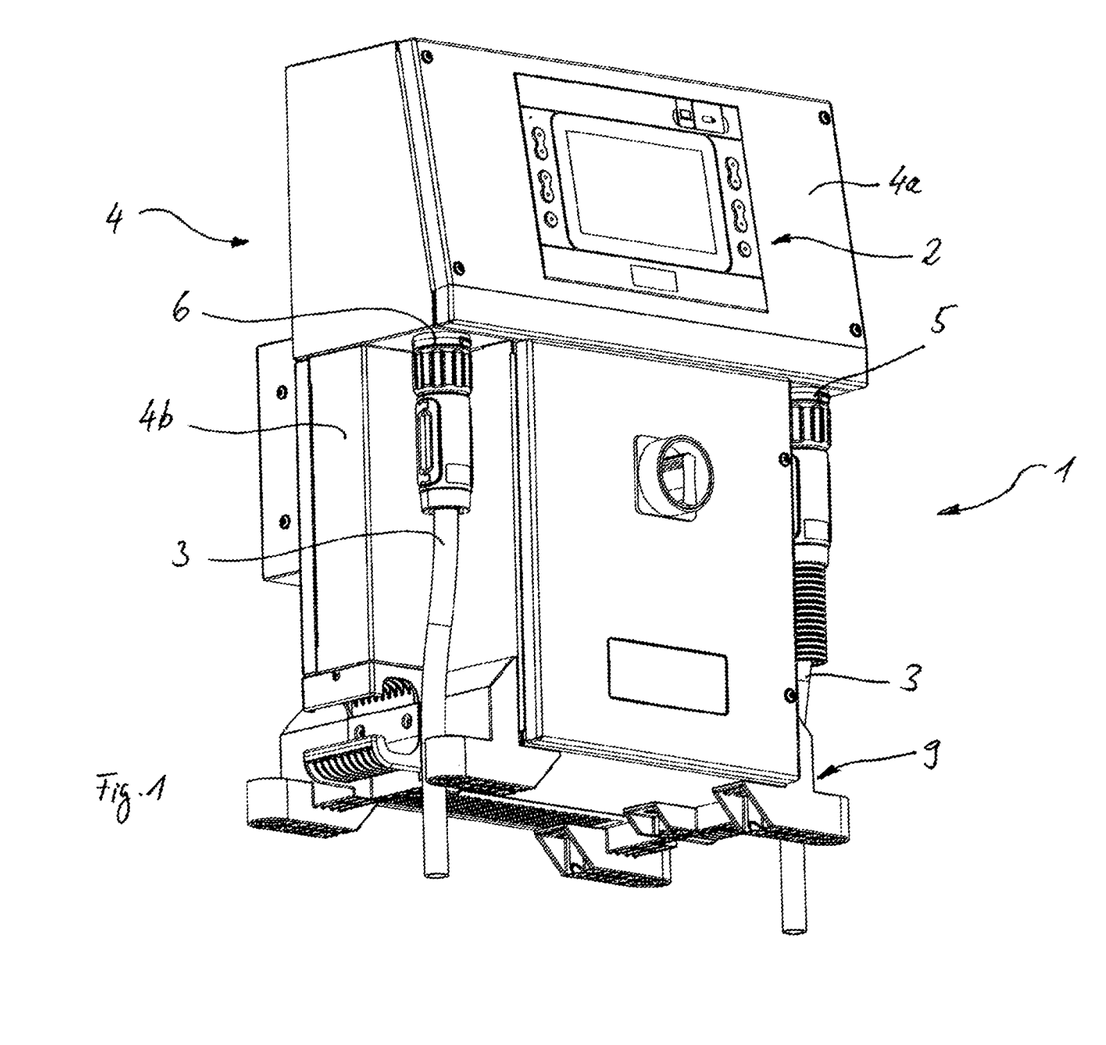
FIG. 1 a perspective view of a welding current source according to the invention for an arc welding process having welding current cables connected to their two pole contact devices.

FIG. 1 depicts a welding current source with which electric current and electric voltage are provided for executing arc welding processes by means of a not further depicted arc welding torch. In addition, the welding current source 1 contains a control device having an operating panel 2, with which one can adjust parameters of the respective arc welding processes to be executed and control the welding process. In this case, using the welding current source 1, one can perform MIG/MAG or also WIG, plasma, electrode as well as all other arc welding processes or high-current applications. In other possible embodiments of the invention, one can also perform other arc welding and cutting procedures using the welding current source 1.

Projecting from a housing 4 of the welding current source 1 are two pole contact devices 5, 6, which are provided for connecting a welding current cable 3 each. As one can see in FIG. 1, the upper section 4a of the housing 4 protrudes on both sides of the housing in relation to the narrow front part 130 of the T-shape of the lower housing section 4b. In regard to the rear, wider part 131 of the T-shape of the lower housing section 4b, the upper housing section 4a has a width that corresponds at least approximately to the width of the rear, wider part 131 of the lower housing section 4b. By means of this design, there results on each of the sides of the housing 4 a region of the upper housing section 4a, in which a lower side 7 of the protruding part of the upper housing section 4a is covered by a housing cover, in this case a housing plate, and which is freely accessible. These two regions of the underside 7 of the upper housing section 4a are rectangular and freely accessible from the front side as well as from a respective side of the housing 4 for access. These two regions of the underside 7 of the upper housing section 4a are separated from each other by the narrow part of the T-shape of the lower housing section. At each of the two regions of the underside 7 of the upper housing section 4a, there is arranged in each case one of the two pole contact devices 5, 6 so that in each case only one of the pole contact devices 5, 6 is located at each of these two regions. At the underside 7 of the upper housing section 4a, the two pole contact devices 5, 6 thus project out of the housing 4 of the preferred power welding source 1 according to the invention. The housing 4 of the welding current source is arranged on a two-part setup element 9, with which the housing can be set up on a substrate.

Figure 2:
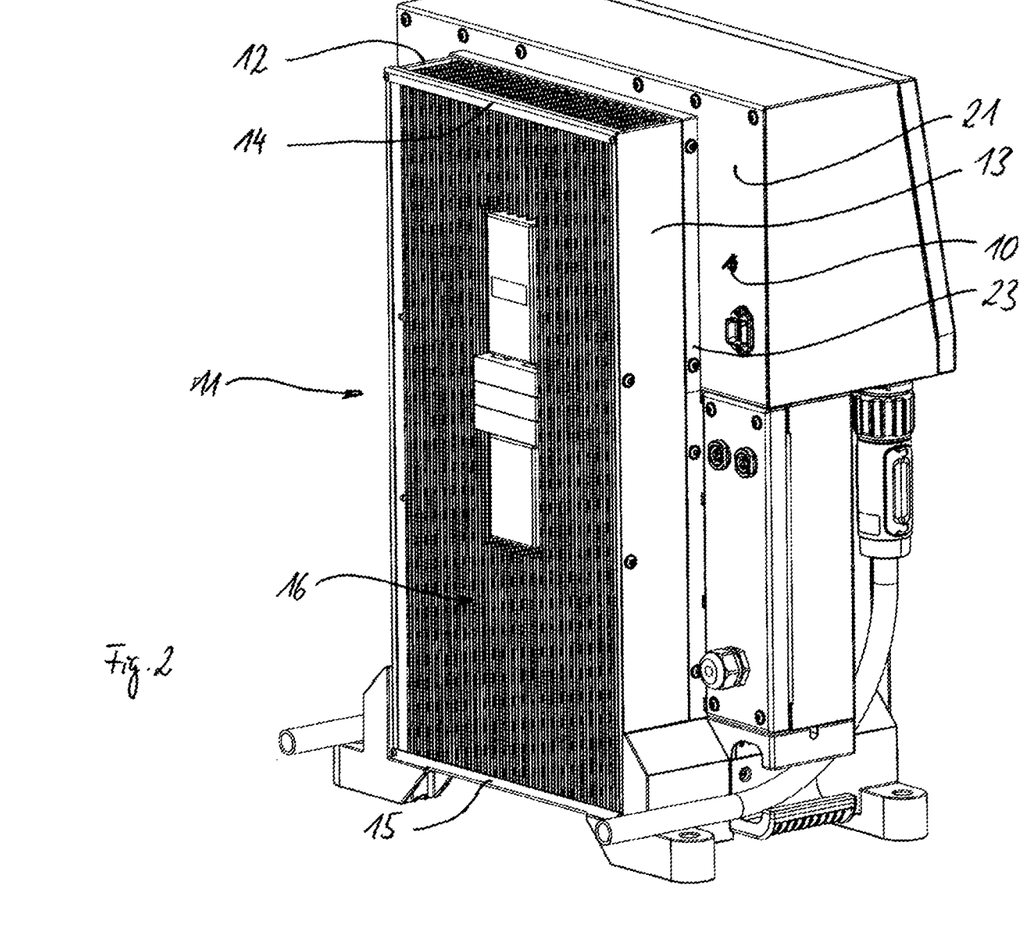
FIG. 2 a perspective view of the welding current source from FIG. 1 looking at a rear side and with the fan cartridge removed.
Figure 3:
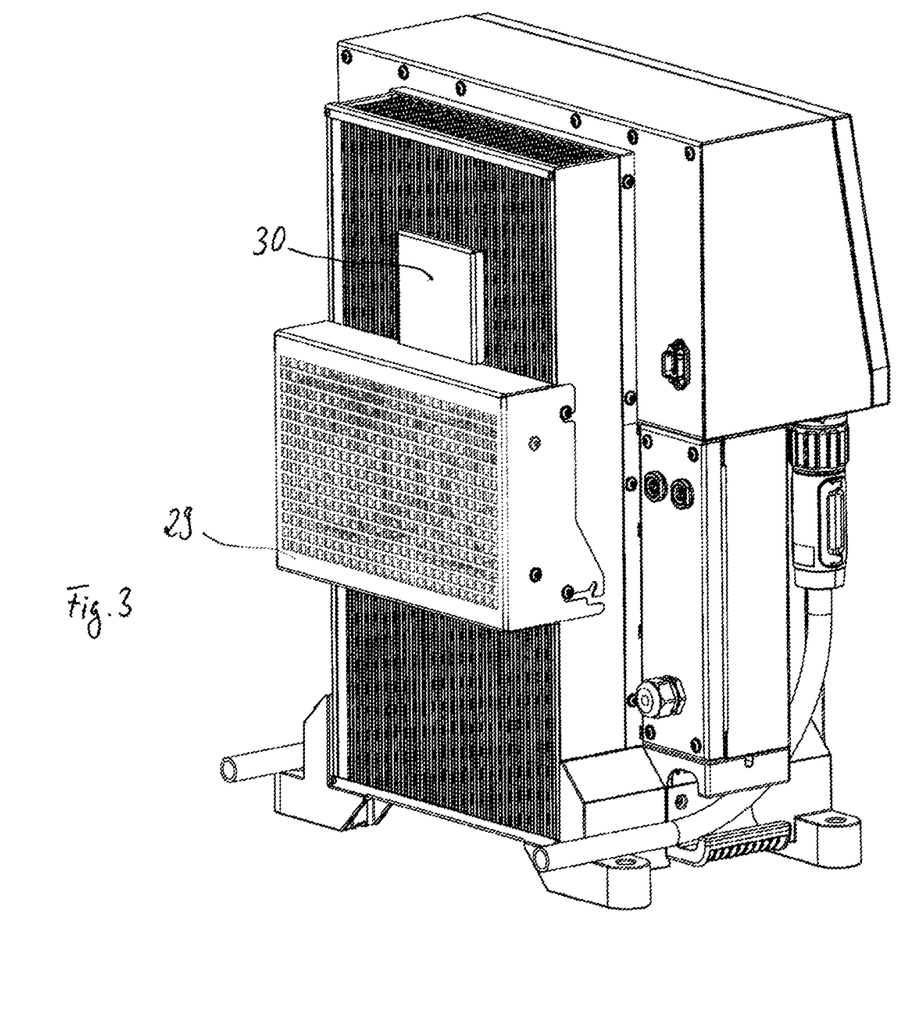
FIG. 3 another perspective view of the welding current source from FIG. 1 with the fan cartridge installed, looking at the rear side.

As FIG. 2 shows, a box- and cuboid-shaped cooling body 11 is arranged on the rear side 10 of the housing 4. The cooling body 11 extends essentially over the entire height of the housing 4 and has two at least essentially vertical side walls 12, 13, which are connected to each other by means of cross members 14, 15. A plurality of cooling ribs 16 is arranged between the side walls. The cooling ribs 16 are oriented parallel to the side walls 12, 13 and thus also at least essentially perpendicular to the housing rear wall 21. The orientation of the cooling ribs corresponds to the inherently self-adjusting heat convection or flow direction of heated air. The length of the essentially equal-length cooling ribs 16 thereby corresponds to the length of the side walls 12, 13. The cooling body 11 is closed toward the housing rear wall 21 of the housing by means of a rear wall 18.

Figure 5:
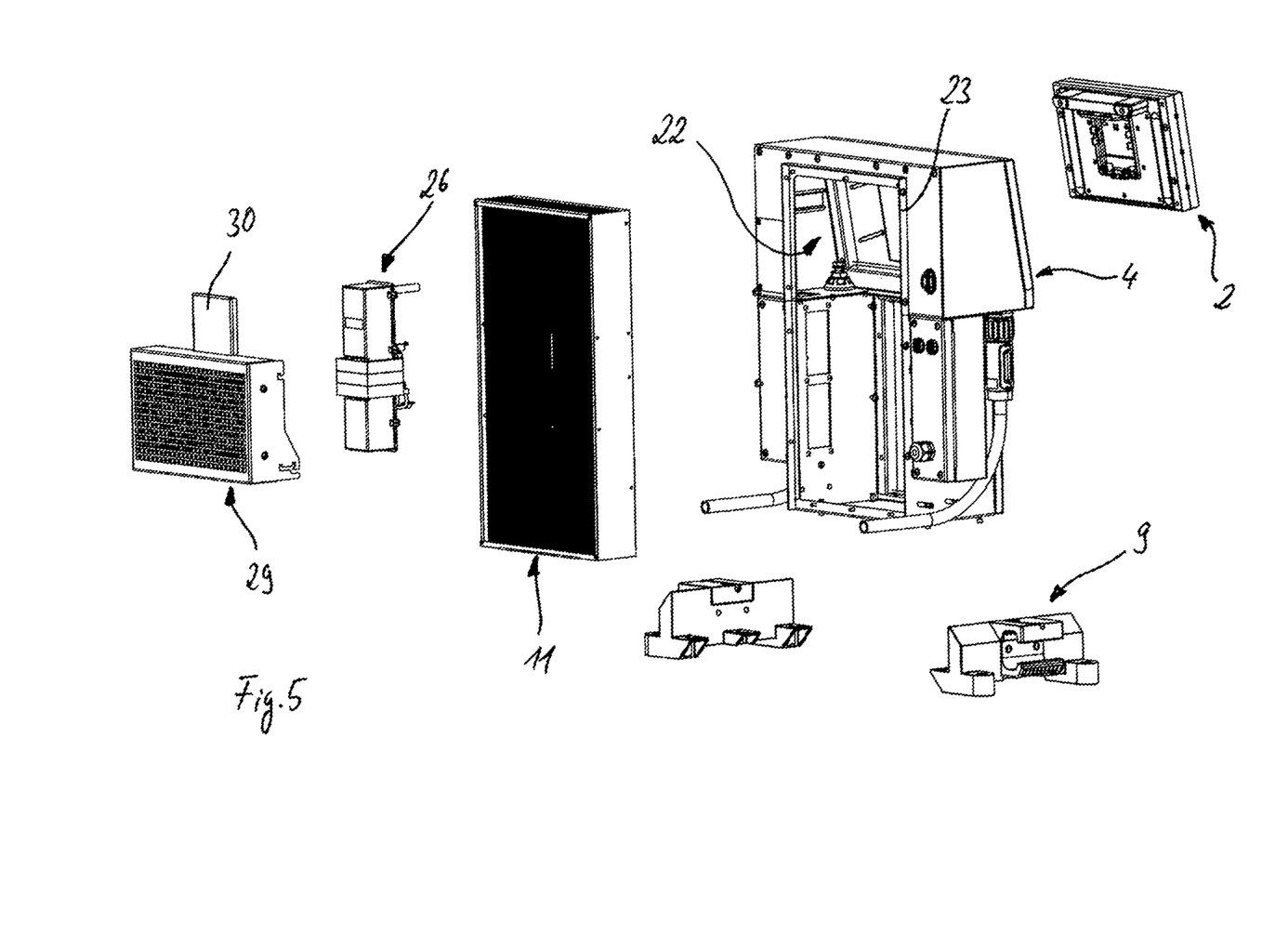
FIG. 5 an exploded view of the welding current source from FIG. 1.

One can infer from the exploded view of FIG. 5 that the rear side 10 of the housing 4 of the welding current source 1 is equipped with a housing rear wall 21, which is equipped with a rectangular recess 22. The shape and size of the recess 22 thereby corresponds essentially to the shape of the cooling body 11. For example, by means of a frame 23 and screw connections, the cooling body 11 can be attached to the rear wall 21 of the housing 4. The recess 22 of the housing rear wall 21 can be completely closed off with the rear wall 18, shown in FIG. 6, of the cooling body 11.

Approximately in the middle of the cooling body, the aluminum cooling ribs 16 arranged in this region are equipped with an elongated, rectangular recess 25, which can be achieved by a milling groove for example. Arranged in the recess 25 is an inductance device 26, which corresponds approximately to the elongated cuboid shape of the recess 25. The inductance device 26 contains at least one transformer and if applicable one or more other inductors. The at least one transformer is encapsulated by a plastic compound for better heat dissipation. The thereby resulting cuboid-shaped block of the inductance device 26 is inserted in the recess 25 of the cooling ribs and attached to the rear wall 18. Electrical connections 27 of the inductance device 26 are run through one or more through-recesses through the rear wall 18, to be electrically connected to the not further depicted electronic components inside the housing. The inductance device thereby covers all through-recesses, provided for this purpose, of the rear wall 18. On the housing inner side, heat-emitting electronic components may be arranged on the rear wall 18. Their thermal power loss can thus be supplied directly via the rear wall 18 to the cooling ribs arranged on the outside of the housing and be dissipated to the environment.

Figure 4:
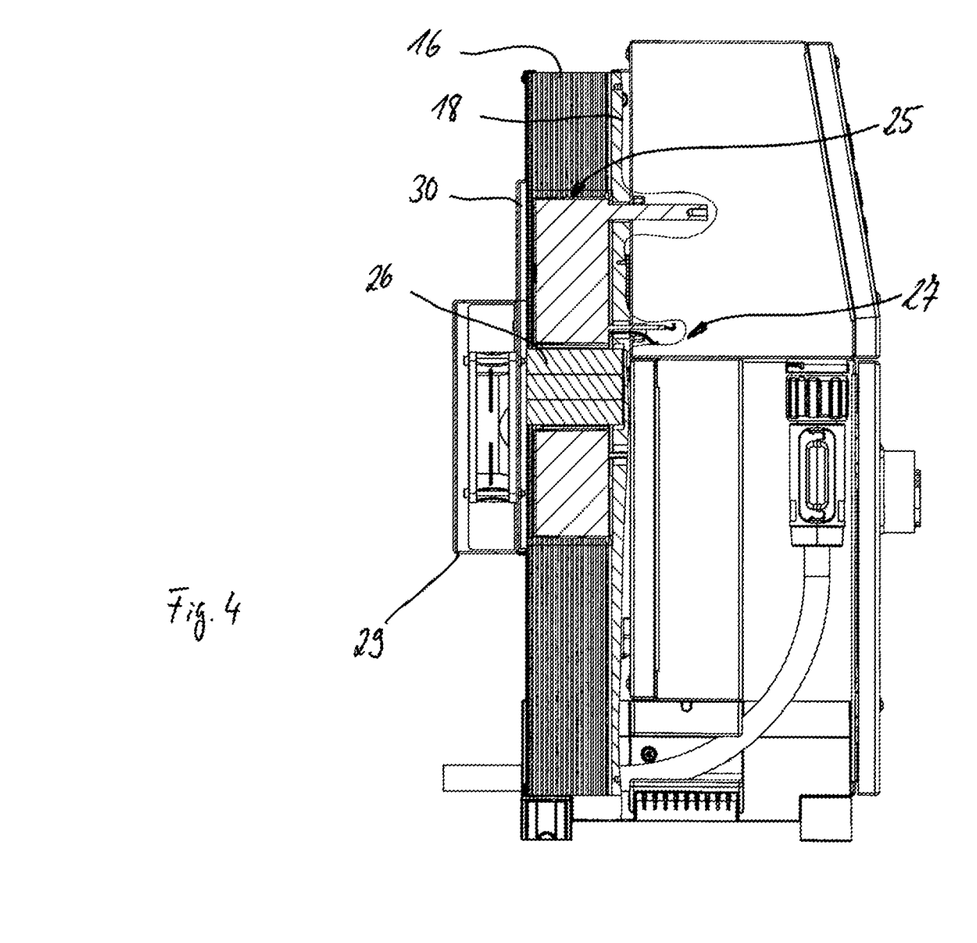
FIG. 4 a side view of the welding current source from FIG. 1 with a cross-sectionally depicted fan cartridge and inductance device.

Optionally, in the depicted preferred embodiment according to the invention, a fan device designed as a fan cartridge 29 may be arranged over the inductance device. The fan device may be equipped with one or more electrically driven fans, wherein the air stream generated by the at least one fan of the fan cartridge 29 is pointed essentially perpendicularly on to the inductance device 26 and the cooling ribs arranged in this region. The fan cartridge 29 covers only a portion of the cooling ribs. On the fan device or cartridge 29, there may be arranged a cover 30, acting as a protection and guide plate, with which a section, protruding beyond the fan device, of the inductance device 26 may be covered. Especially on its upper end, the cover 30 may be arranged with clearance to the inductance device, while it is bent over on its two sides toward the inductance device. The cover 30 can thereby also incorporate the function of forming an upwardly directed flow channel, by means of which air heated by the inductance device can flow away upward.

| List of reference signs | |
|---|---|
| 1 | Welding current source |
| 2 | Operating panel |
| 3 | Welding current cable |
| 4a | Upper housing section |
| 4b | Lower housing section |
| 5 | Pole contact device |
| 6 | Pole contact device |
| 7 | Bottom side |
| 9 | Setup element |
| 10 | Rear side |
| 11 | Cooling body |
| 12 | Side wall |
| 13 | Side wall |
| 14 | Cross member |
| 15 | Cross member |
| 16 | Cooling ribs |
| 18 | Rear wall of cooling body |
| 21 | Housing rear wall |
| 22 | Recess |
| 23 | Frame |
| 25 | Recess |
| 26 | Inductance device |
| 27 | Electrical connections |
| 29 | Fan cartridge |
| 30 | Cover |

The invention claimed is:

1. Welding current source for supplying an electrical welding current circuit with current and voltage for executing an electrical welding process, wherein the welding current source is equipped with a current conditioning device for conditioning the current supplied by the welding current source for suitability for the electrical welding process, there also being provided a housing, the housing of the welding current source comprising two pole contact devices, which each one of the two pole contact devices protrude out of the housing, and the welding current source comprises a cooling device, with which thermal heat loss released by the welding current source can be dissipated, characterized in that an inductance device having at least one transformer is arranged in a cooling body as the cooling device, the cooling body along with the inductance device is positioned on the outer side of the housing of the welding current source, and the cooling device comprises cooling ribs having at least a portion of the cooling ribs adjacent to a cover providing a heat sink on an upper portion of the cooling device.

2. Welding current source according to claim 1, characterized in that the cooling device is arranged on the outer side of a housing rear wall.

3. Welding current source according to claim 1, characterized in that a fan device is arranged on the cooling device facing away from the housing.

4. Welding current source according to claim 1, characterized in that the inductance device is equipped with at least one transformer and at least one additional inductor, which is arranged inside the cooling body of the cooling device, and the cover is in contact with a recess frame.

5. Welding current source according to claim 1, characterized in that the cooling ribs are preferably at least essentially perpendicularly oriented cooling ribs arranged in a spaced apart manner.

6. Welding current source according to claim 1, characterized in that by means of the inductance device the cover provides a current guide plate.

7. Welding current source according to claim 1, characterized in that at least one inductor, especially a transformer, is encased in a plastic compound.

8. Welding current source according to claim 1, characterized in that the cooling device comprises an enclosed recess on the rear wall.

9. Welding current source according to claim 8, characterized in that electronic components of the welding current source are positioned on a housing inner side of the rear wall.

10. Welding current source according to claim 8, characterized by the recess of the rear wall, through which at least one electrical connection of the inductance device is run into the housing of the welding current source.

11. Welding current source according to claim 1, characterized by one or more additional cooling bodies arranged on one or more outer sides of the welding current source, wherein each of the additional cooling bodies comprises an inductance device respectively, and the respective inductance device has at least one transformer.

\* \* \* \* \*